United States Patent [19]
Wadensweiler et al.

[11] Patent Number: 5,978,202
[45] Date of Patent: Nov. 2, 1999

[54] ELECTROSTATIC CHUCK HAVING A THERMAL TRANSFER REGULATOR PAD

[75] Inventors: Ralph M. Wadensweiler; Ajay Kumar; Shashank C. Deshmukh, all of Sunnyvale; Weinan Jiang, San Jose; Rolf A. Guenther, Monte Sereno, all of Calif.

[73] Assignee: Applied Materials, Inc., Santa Clara, Calif.

[21] Appl. No.: 08/883,994

[22] Filed: Jun. 27, 1997

[51] Int. Cl.[6] .................................................. H02N 13/00
[52] U.S. Cl. ............................................ 361/234; 279/128
[58] Field of Search ............................... 361/234; 279/128

[56] References Cited

U.S. PATENT DOCUMENTS

| | | | |
|---|---|---|---|
| 4,502,094 | 2/1985 | Lewin et al. | 361/234 |
| 4,609,037 | 9/1986 | Wheeler et al. | 165/61 |
| 4,645,218 | 2/1987 | Ooshio et al. | 361/234 |
| 4,771,730 | 9/1988 | Tezuka | 118/723 |
| 5,151,845 | 9/1992 | Watanabe et al. | 361/234 |
| 5,155,652 | 10/1992 | Logan et al. | 361/234 |
| 5,426,558 | 6/1995 | Sherman | 361/234 |
| 5,530,616 | 6/1996 | Kitabayashi et al. | 361/234 |
| 5,581,874 | 12/1996 | Aoki et al. | 29/825 |
| 5,625,526 | 4/1997 | Watanabe et al. | 361/234 |
| 5,671,116 | 9/1997 | Husain | 361/234 |

FOREIGN PATENT DOCUMENTS

| | | |
|---|---|---|
| 0360529 | 9/1989 | European Pat. Off. . |
| 0512936 | 4/1992 | European Pat. Off. . |

OTHER PUBLICATIONS

U.S. Patent Application entitled, "Electrostatic Chuck with Conformal Insulator Film"; filed Jan. 31, 1995; Serial No. 08/381,786; Inventors: Shamouilian, et al.; Attorney Docket No. 527.P1.

*Primary Examiner*—Fritz Fleming
*Attorney, Agent, or Firm*—Ashok Janah

[57] ABSTRACT

An electrostatic chuck 75 for holding a substrate 25 in a process chamber 20, comprises an electrostatic member 80 including an insulator having an electrode 95 therein and a receiving surface for receiving the substrate. A base 85 supports the electrostatic member, the base having a first thermal resistance $R_B$ and having a lower surface that rests on the process chamber. A thermal transfer regulator pad 100 is positioned between the receiving surface of the electrostatic member and the lower surface of the base, the thermal pad comprising a second thermal resistance $R_P$ that is sufficiently higher or lower than the thermal resistance $R_B$ of the base, to provide a predetermined temperature profile across a processing surface of the substrate during processing in the chamber.

38 Claims, 4 Drawing Sheets

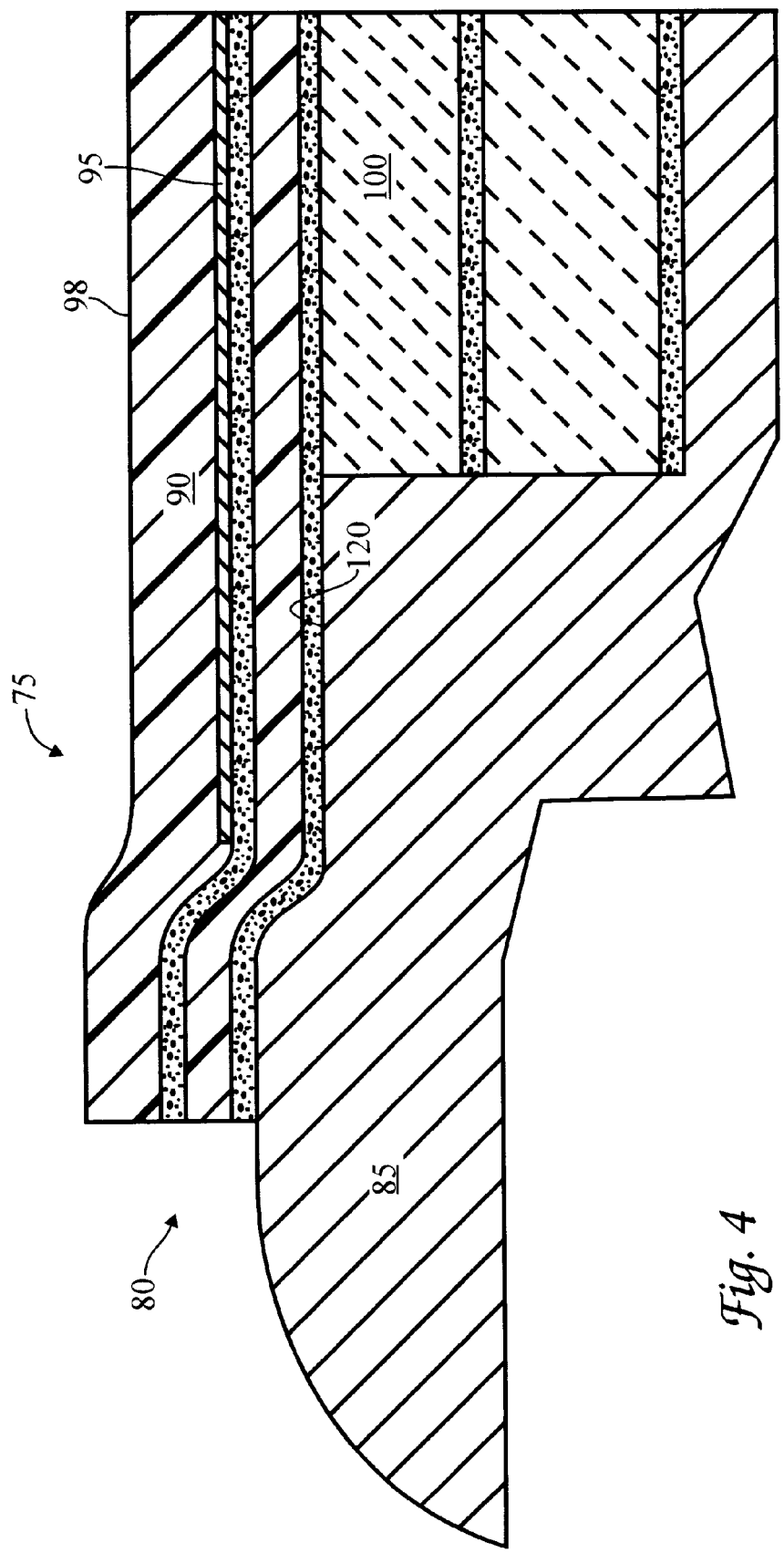

ELECTROSTATIC CHUCK HAVING A THERMAL TRANSFER REGULATOR PAD

BACKGROUND

The present invention relates to electrostatic chucks for holding substrates in process chamber. The present invention is also related to In semiconductor fabrication processes, chucks are used to hold semiconductor substrates to prevent movement or misalignment of the substrate during processing. Electrostatic chucks, which use electrostatic attraction forces to hold a substrate, have several advantages over mechanical and vacuum chucks. Electrostatic chucks reduce stress-related cracks which are often caused by mechanical clamps; allow utilization of a larger portion of the substrate surface; reduce formation of corrosion particles which deposit on the substrate; and allow use of the chuck in vacuum processes.

A typical electrostatic chuck includes an electrostatic member supported by a thermally conductive base in a process chamber. The electrostatic member includes at least one electrode covered by, or embedded in, an electrical insulator or dielectric material. The electrode of the electrostatic member is electrically biased with respect to the substrate by an electrical voltage, causing electrostatic charge to accumulate in the electrostatic member. In monopolar electrostatic chucks, a plasma in the process chamber provides electrically charged species that accumulate in the substrate. The accumulated charge in the substrate has opposing polarity to the charge accumulated in the electrostatic member, resulting in an attractive electrostatic force that holds the substrate to the chuck. In bipolar electrostatic chucks, a plurality of electrodes are charged to different electrical potentials to electrostatically hold the substrate to the chuck.

During processing, the substrate and underlying chuck are exposed to high temperatures that can cause undesirable temperature gradients across the surface of the substrate. In conventional chucks, the electrostatic member is typically directly bonded to the thermally conductive base, and the heat from the substrate travels through the electrostatic member to the base. Differences in heat conduction or heat generation in conventional chucks can cause temperature gradients across the processing surface of the substrate. For example, temperatures at the perimeter of the substrate are often higher or lower than temperatures at the center of the substrate. In plasma processes, this temperature variation can occur due to differences in plasma density at the center and perimeter of the substrate. During processing, discharge of thermal energy from the plasma to the substrate increases its temperature. Higher plasma density at portions of the substrate result in higher thermal discharge and higher substrate temperatures.

The temperature variations across the substrate can also be caused by differences in electric field flux and RF energy arising from different electrical impedances across the substrate. For example, RF energy fields can accumulate at low impedance areas around the perimeter of the substrate, increasing the temperature of the substrate at its perimeter relative to its center. The higher temperatures at the perimeter of the substrate also occur when the substrate perimeter forms an overhang that is not in direct thermal contact with the thermally conductive base of the chuck. As a result, heat from the perimeter of the substrate dissipates at a lower rate than the heat from the central of the substrate. As a result, the steady state temperatures at the perimeter and center of the substrate can vary by as much as 5 to 10° C., during processing of the substrate.

While temperature gradients across the substrate surface are generally undesirable, in certain fabrication processes, it may become desirable to maintain a predefined temperature profile across the substrate to compensate for other variations in processing conditions across the substrate surface, for example, process gas flow or RF plasma energy. However, uncontrolled or fluctuating temperature gradients across the processing surface of the substrate are not desirable. In deposition processes, such fluctuating temperature variations can result in deposition of a film having varying grain size, surface roughness, or film structure across the substrate, which changes the electrical properties of the deposited films. In etching processes, fluctuating temperature gradients can cause profiles of etched features to vary across the substrate surface, with some portions of the substrate having etched features that are substantially straight walled and other portions having etched features with tapered sidewalls. Also, lower temperatures can cause excessive deposition of passivating polymeric deposits (because the sticking coefficient of the polymeric deposits is higher) resulting in more tapered etched features at portions of the substrate. This variation in etched feature profile is undesirable and such excess passivating deposits are difficult to remove from the substrate.

Thus there is a need for an electrostatic chuck capable of maintaining predefined temperature profiles across the processing surface of the substrate. In certain processing applications, it is desirable to maintain the center of the substrate at higher or lower temperatures relative to the perimeter of the substrate to compensate for other variations in processing conditions across the substrate surface, for example, differences in plasma density or electrical impedances. In other processes, there is a need for an electrostatic chuck that can provide a substantially uniform and consistent temperature profile from the center to the perimeter of the substrate.

SUMMARY

The present invention provides an electrostatic chuck for holding a substrate and maintaining a predefined temperature profile from a center to a perimeter of a processing surface of a substrate. The electrostatic chuck comprises an electrostatic member having an insulator with at least one electrode therein, and a receiving surface for receiving the substrate. A base supports the electrostatic member, the base having a first thermal resistance $R_B$ and having a lower surface that rests on the process chamber. A thermal transfer regulator pad is positioned between the receiving surface of the electrostatic member and the lower surface of the base, the thermal pad comprising a second thermal resistance $R_P$ that is sufficiently higher or lower than the thermal resistance $R_B$ of the base, to provide a predetermined temperature profile across a processing surface of the substrate during processing in the chamber. Preferably, the thermal transfer regulator pad lies between the electrostatic member and the base. When used to hold a substrate in a process chamber having a gas distributor for introducing process gas into the chamber, and a plasma generator for forming a plasma from the process gas, the chuck provides a predetermined temperature profile across the surface of the substrate and thereby improves processing uniformity across the substrate.

In one aspect of the present invention, the thermal transfer regulator pad comprises a thermal barrier pad positioned between the electrostatic member and the base. The thermal barrier pad comprising a second thermal resistance $R_P$ sufficiently higher or lower than the first thermal resistance $R_B$ of the base, to provide the desired predetermined temperature profile across the processing surface of the substrate. The thermal barrier pad comprises a circular disc or annular rings, that have a rectangular or tapered cross-section, and which are sized smaller than the base of the chuck.

In another aspect, the present invention provides a method of maintaining a predetermined temperature profile across a processing surface of a substrate. The method comprises the steps of (a) electrostatically holding a substrate to the chuck; (b) maintaining first thermal transfer pathways having a thermal resistance $R_B$ in portions of the chuck; and (c) maintaining second thermal transfer pathways having a thermal resistance $R_P$ in other portions of the chuck, the thermal resistance $R_P$ being selected to provide a predetermined temperature profile across the processing surface of the substrate held on the chuck during processing of the substrate.

DRAWINGS

These and other features, aspects, and advantages of the present invention will become better understood with regard to the following description, appended claims, and accompanying drawings which illustrate examples of the invention, where:

FIG. 4 is a partial sectional schematic view of an embodiment of the electrostatic chuck of the present invention showing details of the electrostatic member and thermal transfer regulator pad.

DESCRIPTION

Figure 1:
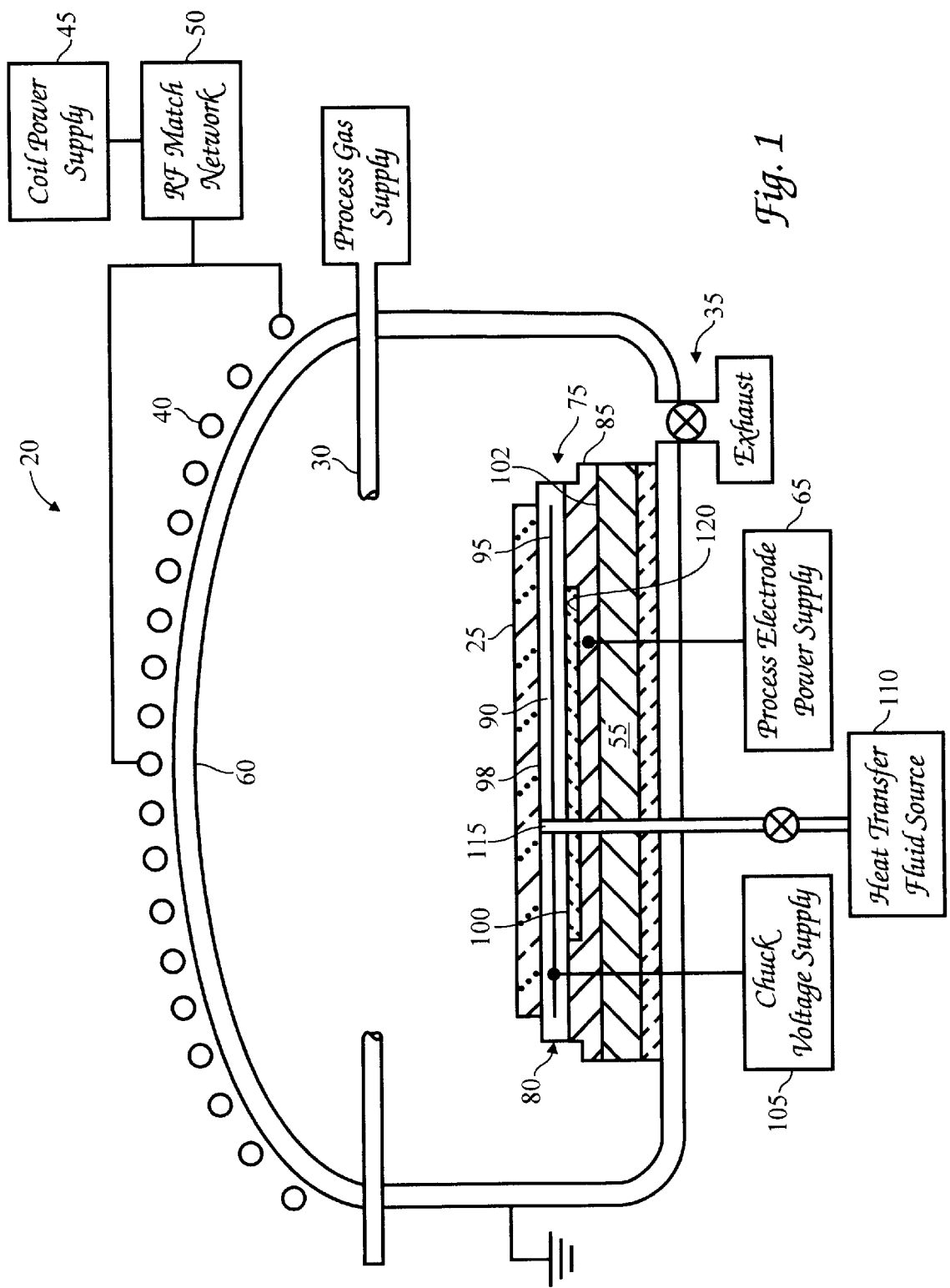
FIG. 1 illustrates a schematic sectional view of a process chamber according to the present invention.

The present invention provides an electrostatic chucking system for holding a substrate in a process chamber, and for maintaining a predefined temperature profile from the center to the perimeter of the substrate. An exemplary process chamber of the present invention, suitable for plasma processing of semiconductor substrates, is illustrated in FIG. 1. The particular embodiment of the process chamber 20 shown herein is provided only to illustrate operation of the invention and should not be used to limit the scope of the invention. The process chamber 20 can be used to deposit material on the substrate 25 such as by chemical vapor deposition, etch material from the substrate, or implant material on the substrate. Chemical vapor deposition (CVD) processes that can be performed in the apparatus to deposit coatings on the substrate 25, are generally described in Chapter 9, VLSI Technology, 2nd Ed., Ed. by Sze, McGraw-Hill Publishing Co., New York, which is incorporated herein by this reference. For example, CVD processes for depositing $SiO_2$ on a substrate 25, use process gases such as (i) silicon source gas for example $SiH_4$ or $SiCl_2H_2$, and an oxygen source gas such as $CO_2$, or $N_2O$; or (ii) a single gas containing both silicon and oxygen such as $Si(OC_2H_5)_4$. CVD processes for depositing $Si_3N_4$ typically use gases such as $SiH_4$ and $NH_3$ or $N_2$. Other conventional CVD process gases include $NH_3$, $AsH_3$, $B_2H_6$, KCl, $PH_3$ and $SiH_4$. The apparatus can also be used for plasma etching processes as generally described in *VLSI Technology, Second Edition*, Chapter 5, by S. M. Sze, McGraw-Hill Publishing Company (1988), which is incorporated herein by reference. Typical etching processes for etching metal layers use process gases such as $BCl_3$, $Cl_2$, $SF_6$, $CF_4$, $CFCl_3$, $CF_2Cl_2$, $CF_3Cl$, $CHF_3$, HCl, or $C_2ClF_5$. Resist etching processes typically use oxygen gas to etch the polymeric resist on the substrate 25.

The process gas used to deposit material on, etch, or implant material in the substrate 25 is introduced into the chamber 20 through a gas distributor 30 that distributes the process gas in the chamber, and an exhaust manifold 35 is provided for withdrawing spent process gas and process gas byproducts from the chamber 20. The process gas in the chamber 20 can be inductively coupled to form a plasma using an inductor coil 40 wound around the chamber and operated using a coil power supply 45 and an RF matching network 50. The process gas can also be capacitively coupled by processes electrodes 55, 60 in the chamber 20. In the example shown herein, one of the process electrodes 55 is located below the substrate 25, and the other process electrode 60 is formed by electrically grounding the walls of the process chamber 20. A process electrode bias voltage supply 65 is used to supply an RF bias voltage to the process electrode 55 to electrically bias the process electrodes with respect to one another to form an RF bias capacitively coupled plasma in the chamber 20. A suitable voltage supply 65 comprises an RF impedance that matches the impedance of the process chamber 20 to the impedance of the line voltage, in series with an isolation capacitor. Combined inductive and capacitive coupling can be used to form a more uniform and directed plasma in the chamber 20. Also, the plasma can be enhanced using a magnetic field generator (not shown) coupled to the process chamber 20.

Referring to FIGS. 2a to 2d, an electrostatic chuck 75 comprises an electrostatic member 80 supported on a base 85 in the process chamber 20. The electrostatic member 80 comprises a dielectric or insulator 90 covering, or having embedded therein, at least one electrode 95, and having a receiving surface 98 for receiving the substrate 25 thereon. A thermal transfer regulator pad 100 is positioned between the receiving surface 98 of the electrostatic member 80 and the lower surface 102 of the base 85 to control the transfer or flow of heat from the substrate 25. Preferably, the thermal transfer regulator pad 100 is positioned in the electrostatic chuck 75 so that the entire chuck assembly can be easily replaced. More preferably, thermal transfer regulator pad 100 is positioned between the electrostatic member 80 and the base 85 to control the transfer or flow of heat from the substrate 25 through the electrostatic member 80 and base 85. Alternatively, the thermal transfer regulator pad 100 can also form a portion of the upper surface of the electrostatic member 80 that is in direct thermal control with the substrate 25.

A chuck voltage supply 105 provides a voltage suitable for operating the electrodes 95 of the chuck 75. Typically, the voltage applied to the electrode 95 of the chuck is a DC voltage of from about 1000 to about 3000 volts. The chuck voltage supply 105 can also comprise a plurality of voltage sources that maintain two or more electrodes 95 of the chuck 75 at different voltages to operate the electrodes as bipolar electrodes. Such voltage supplies are conventional, as disclosed in for example, U.S. patent application Ser. No. 08/381,786, which is incorporated herein by reference.

Figure 3:
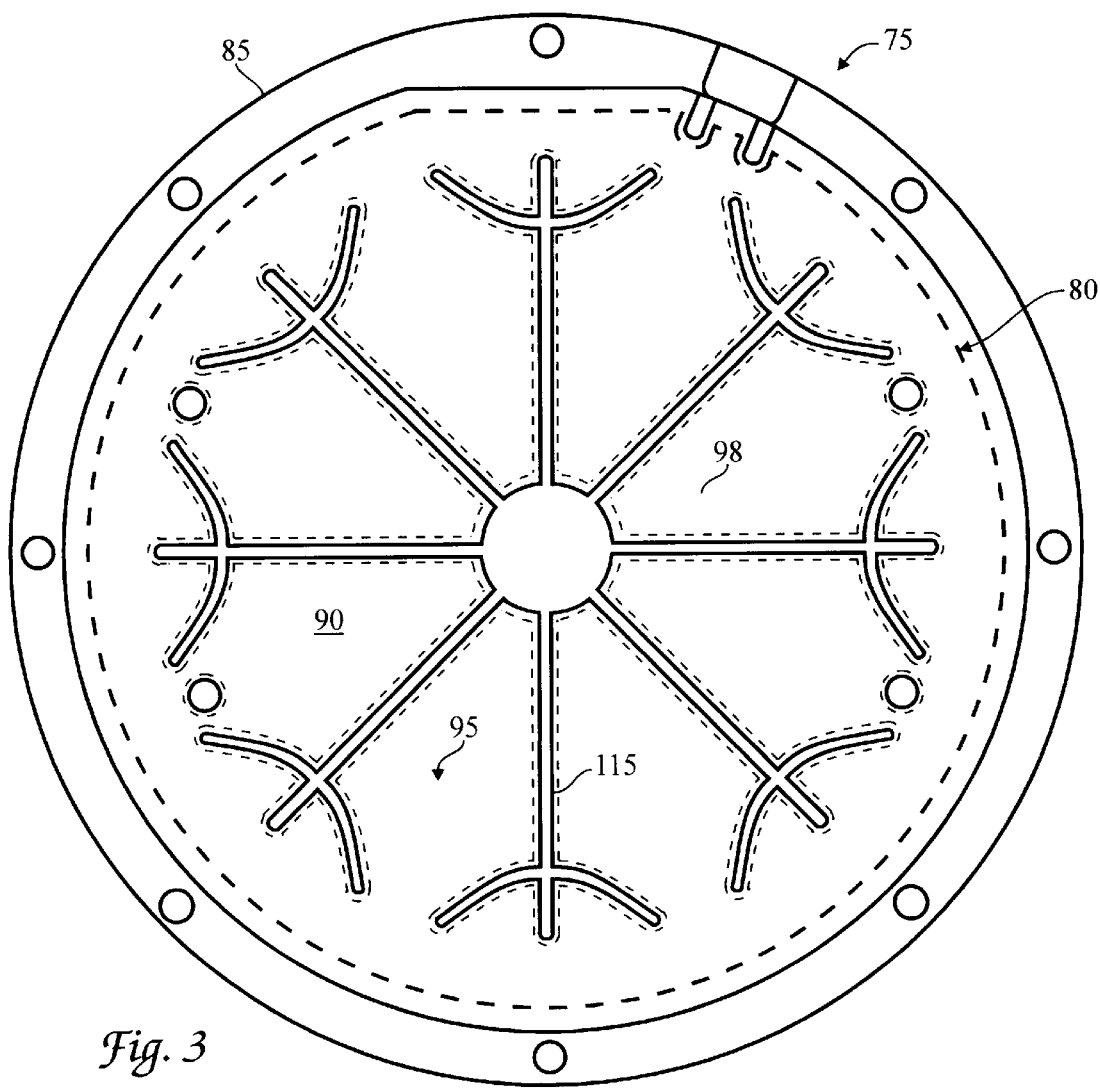
FIG. 3 is a schematic top view of an electrostatic chuck according to the present invention showing heat transfer fluid grooves in the chuck.

Heat transfer fluid such as helium, argon, nitrogen or neon can be used to promote heat transfer from the substrate 25 to maintain the substrate at substantially constant temperatures during processing. For example, helium gas can be introduced in a gap between the substrate 25 and the electrostatic member 80 to facilitate thermal coupling between the substrate and the chuck 75. Without this gas coupling, the temperature of the substrate 25 can be non-uniform across the substrate surface or gradually increase over time. The heat transfer fluid is provided by a heat transfer fluid source 110 and regulated using conventional gas flow regulators and pressure controllers. As illustrated in FIG. 3, preferably, the heat transfer fluid is held in heat transfer fluid grooves 115 in the surface of the electrostatic member 80 that extend through the entire, or a portion of, the thickness of the electrostatic member. The grooves 115 typically comprise a network of radial and concentric circular grooves, preferably joined together to form a continuous network that holds heat transfer fluid below the substrate 25.

The electrostatic chuck 75 of the present invention controls the heat transfer rates from different portions of the substrate 25 through the electrostatic chuck 75 to provide a predetermined temperature profile across the processing surface of the substrate. The base 85 below the electrostatic member 80 comprises a first thermal resistance $R_B$, and the thermal transfer regulator pad 100 comprises a second thermal resistance $R_P$ that is different from the first thermal resistance $R_B$. The difference in thermal resistance $\Delta R = R_P - R_B$, is selected to provide a predetermined temperature profile across the processing surface of a substrate 25 held on the chuck 75. The thermal resistance $R = L/kA$, where L is the thickness, k is the thermal conductivity, and A is the surface area of the base 85 or pad 100. Preferably, the base comprises a thermal conductivity $K_B$ of from 20 to 2000 Watts/mK, and the pad comprises a thermal conductivity $K_P$ of from 0.01 to 3.0 watts/mK. The first thermal resistance $R_B$ of the base 85 is the average thermal resistance through the thickness $L_B$ of the base. Where portions of the base 85 directly contact the substrate 25, the thermal resistance $R_B$ is the thermal resistance through the thickness of the base below the directly contacting portions of the base. Preferably, $R_B$ is from about $0.2 \times 10^{-3}$ to about $20 \times 10^{-3}$ K/W, and the thermal resistance $R_P$ is from about $50 \times 10^{-3}$ to about $400 \times 10^{-3}$ K/W. The pad 100 comprises a second thermal resistance $R_P$ which is the average thermal resistance through the thickness $L_P$ of the pad. Where the pad 100 tapers in the thickness, the thermal resistance $R_P$ is the average thermal resistance through the thicker portions of the pad. Preferably, the difference in thermal resistances $\Delta R$ is from about 10 to about 1000 K/W.

The difference $\Delta R$ between the thermal resistance $R_P$ of the pad 100 and the thermal resistance $R_B$ of the base 85, is selected to be sufficiently high to provide a predetermined or predefined temperature profile across the surface of a substrate 25 held on the chuck 75. To determine a suitable configuration of the pad 100, a first steady state temperature profile across the surface of the substrate 25 during processing of the substrate in a predefined set of processing conditions, is measured. The temperature profile across the substrate 25 is the temperature at different locations across the processing surface from the center to the perimeter of the substrate. By steady state temperature gradient it is meant the relatively constant temperature gradient that occurs during processing of the substrate in a particular set of process conditions. The temperature profile across the substrate 25 is determined by measuring the temperature across the substrate surface using a scanning temperature sensor such as an infrared sensing system, optical pyrometers, thermocouples, or resistance temperature detectors, coupled to a suitable computer system which records the temperature profile from the scan. Infrared sensor systems are preferred because of their low thermal mass, high accuracy after calibration, and ease of scanning. The temperature sensor system measures and stores temperature data across the substrate surface when the substrate 25 reaches steady state equilibrium temperatures. Typically, the temperature sensor system scans across from the center to the perimeter of the substrate 25 to obtain a temperature scan. The temperature profile across substrate surface is typically symmetrical from the center to the perimeter of the substrate 25, with the temperature gradients occurring in concentric circles across the substrate surface.

The steady state temperature profile, i.e., the range or distribution of temperatures $\Delta T$ from the center to the perimeter of the substrate surface, is correlated to observed variations in processing rates or characteristics across the substrate surface. The process variations (such as deposition thickness or characteristics of etched features) across the substrate surface are measured using conventional techniques, for example, scanning electron micrographs of sections of the substrate after processing, resistance measurements across the substrate surface, or other conventional test methods. For example, in etching processes, sections of the processed substrate are mounted to allow viewing of the cross-sectional profiles of the etched features on the substrate, and the dimensions of the etched features is measured to provide a graph or table of the variation or change in sidewall tapering angle, height, or loss in critical dimensions of the etched features as a function of their position on the substrate surface.

The observed processing variations and the steady state temperature gradient for a given set of process conditions are then used to select the thermal conductivity, shape, size, and position, of the thermal pad 100. In particular, the difference in thermal resistance $\Delta R$ of the first and second thermal resistances $R_B$ and $R_P$, is selected to provide a plurality of thermal transfer pathways that provide preferentially heating, cooling, or uniform temperatures gradients across the substrate surface to substantially reduce variations in processing rates or uniformity across the substrate surface. Further proof type experiments are then conducted to determine whether the selected pad 100 will provide the desired temperature gradient across the substrate 25. These experiments and pad configurations are repeated until the selected properties, shape, and position of the pad 100 provides a difference in thermal resistance $\Delta R$ that results in a desired temperature distribution across a substrate 25 for a particular set of processing conditions.

During processing of the substrate 25 held on the chuck 75, portions of the chuck 75 or base 85 that do not have an interlying pad 100 comprise first thermal flow pathways with first thermal resistances $R_B$, and portions of the base in contact with the pad 100 comprise second thermal flow pathways with second thermal resistance $R_B$. The predetermined temperature profile across the surface of the substrate 25, which corresponds to the difference in thermal resistances of the first and second thermal flow pathways at different portions of the chuck, provides significantly improved processing uniformity across the substrate surface, particularly for processes where steady state temperature differences occur across the substrate surface during processing.

Figure 2A:
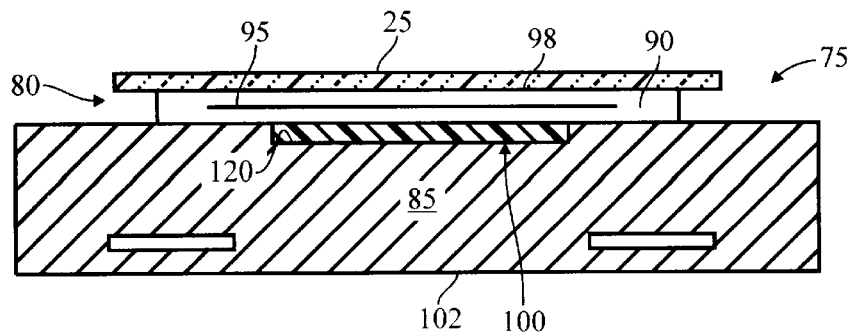
FIGS. 2a to 2d illustrate schematic sectional views of different versions of electrostatic chucks according to the present invention.
Figure 2B:
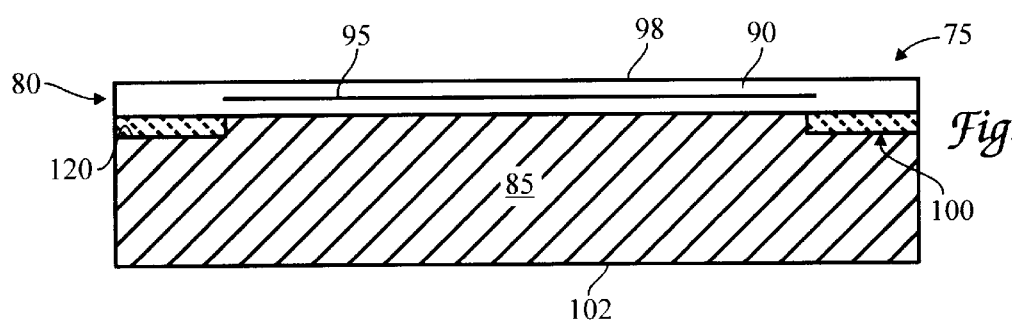
Figure 2C:
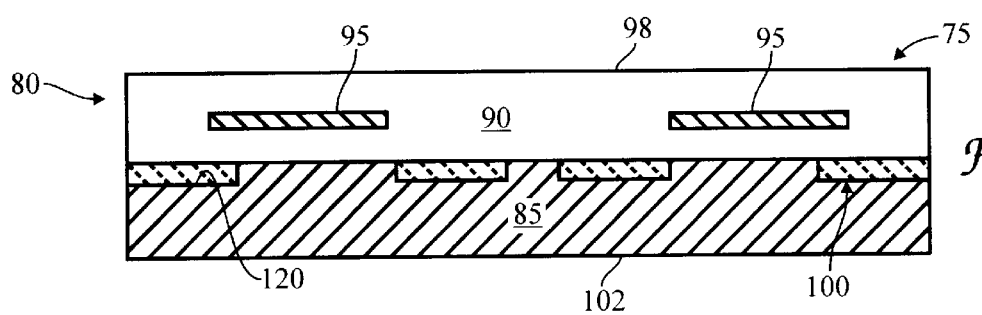
Figure 2D:
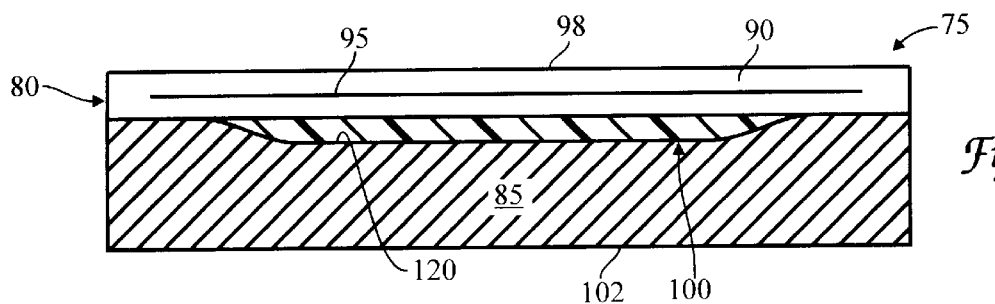

In one version, the electrostatic chuck 75 of the present invention maintains the center and perimeter of the substrate 25 at substantially equivalent temperatures. Differences in temperature between the center and perimeter can lead to tapered etch profiles or buildup of passivating polymer deposits at low temperature regions of the substrate 25 leading to non-uniform etching of the substrate. The temperature at the center of the substrate 25 can be higher or lower than the temperature at the perimeter of the substrate. Moreover, the temperature gradient is typically symmetrical across the substrate surface. Thus the pad 100 preferably comprises a symmetric circular shape, for example, a solid circular disc extending below a central portion of the substrate 25 as shown in FIGS. 2a and 2d, or a series of annular rings 100 that are shaped and sized to lie below the substrate with a circular gap portions between the rings, as shown in FIGS. 2b and 2c.

In the exemplary version shown in FIG. 4, the pad 100 comprises a circular disc that fits in a central depression 120 of the chuck 75 that is shaped and sized to receive the pad 100. The pad 100 is coextensive with the central portion of the electrostatic member 80 and a portion of the electrostatic member extends beyond the periphery of the pad 100. The depression 120 in the base 85 of the chuck 75 is cylindrical in shape with a diameter and a depth selected to match the diameter and thickness of the pad 100. In this version, the pad 100 comprises a diameter $D_P$ smaller than the diameter $D_B$ of the base 85, and can comprise a thermal conductivity $k_P$ that is higher or lower than the thermal conductivity of the base $K_B$ depending on the desired thermal resistance difference $\Delta R$ between the pad 100 and the base 85.

For example, when steady state temperatures are lower at the center of the substrate 25 than the perimeter of the substrate, the pad 100 comprises a thermal barrier material that is more thermally insulating than the base, or which has a thermal conductivity $k_P$ lower than the thermal conductivity $k_B$ of the base 85. The pad 100 is centrally positioned below the substrate 25 to reduce heat transfer flow from the central portion of the substrate 25 to raise the effective steady state temperatures at the central portion of the substrate. The difference in diameters between the pad 100 and the base 85, and the shape of the pad is selected depending on the temperature profile across the substrate 25, to maintain the desired temperature profile from the center to the perimeter of the substrate 25. The heat transfer rates from a particular location on the substrate 25 depends on whether the pad 100 extends to below that particular location on the substrate and the thermal conductivity $k_P$ and thickness $L_P$ of the pad at that location. Thus, to obtain a particular temperature profile across the substrate 25, the diameter $D_P$, thermal conductivity $k_P$, and thickness $L_P$ of the circular barrier pad 100 are selected to provide the desired thermal resistance profile. The base 85 is only in direct thermal contact with the portion of the electrostatic member 80 extending beyond the periphery of the pad 100 and provides faster thermal transfer rates at the perimeter of the substrate 25 by more rapidly dissipating heat from the substrate. Because the thermal resistant pad 100 has a higher thermal resistance $R_P$ than the thermal resistance $R_B$ of the base 85, the pad lowers transfer of heat from the central area of the substrate 25 to maintain the center of the substrate at steady state temperatures substantially equivalent to those at the substrate perimeter.

Another embodiment of the electrostatic chuck 75 is useful for processes where it is desirable to maintain different steady state temperatures at different portions of the substrate 25 (typically at the center and perimeter of the substrate) during processing of the substrate. For example, the thermal resistance $R_P$, shape, size, and position of the pad 100 can be selected to increase or reduce thermal heat transfer rates from the central or peripheral portions of the substrate 25. For example, when hotter temperatures are desired at the center of the substrate, the pad 100 can comprise a centrally positioned circular pad having a thermal resistance $R_P$ sufficiently higher than the thermal resistance $R_B$ of the base 85 to maintain temperatures at the center of the substrate 25 about 1° C. to about 10° C. higher than the temperatures at the perimeter of the substrate. Hotter temperatures at the central portion of the substrate can also be obtained using a peripherally positioned annular ring shaped pad 100, as illustrated in FIG. 2b, that comprises a thermal conductor having a thermal conductivity higher than that of the base 85 to increase the heat transfer rates from the substrate perimeter relative to the center.

Alternatively, the thermal resistance $R_P$, and shape, size, and relative position of the pad 100 can also be selected to reduce heat transfer rates at the peripheral portion of the substrate 25 to maintain the periphery or perimeter of the substrate at temperatures higher than the center of the substrate. This can be accomplished using a low thermal conductivity, annular ring shaped pad 100 below the periphery of the substrate 25 or a high thermal conductivity, disc shaped pad 100 below the central portion of the substrate 25. In this version, the thermal resistance $R_P$ of the annular ring pad 100 is maintained sufficiently higher or lower than the thermal resistance $R_B$ of the base 85 to maintain temperatures at the center of the substrate about 0° C. to about 10° C. lower than temperatures at the perimeter of the substrate.

In another configuration, the pad 100 can comprise a plurality of segments or annular rings, as illustrated for example in FIG. 2c, that are shaped and positioned in the chuck 75 according the temperature profile desired across the substrate surface. The segmented pad 100 can comprise uniformly thick portions, thicker and thinner portions, or can comprise one or more pads having stepped heights at different diameters. For example, in the configuration shown in FIG. 2c, the thermal pad 100 comprises two annular rings positioned at inner and outer circumferences in the base. The segmented pad 100 provides a stepped temperature gradient across from the center to the perimeter of the substrate 25. The pad 100 is positioned in depressions 120 in the base 75 that have matching cross-sectional profiles.

In yet another configuration, illustrated by way of example in FIG. 2d, the thickness of the pad 100 is tailored to vary according to the desired temperature profile across the substrate surface. For example, the pad 100 can be thicker at its middle and thinner at the periphery, vice versa, or can comprise stepped heights at different diameters. For example, the thermal pad 100 can comprise a thicker central portion and a thinner perimeter portion that gradually tapers in cross-section at its outer circumference, or from the center to the perimeter of the pad. In this version, the thickness of the pad 100 gradually decreases from the center to the perimeter of the pad, to gradually reduce (or increase) the thermal resistance $R_P$ of the pad. The tapered pad 100 is positioned in a depression 120 in the chuck 75 that has a matching tapered cross-section which is shaped and sized to receive the pad so that the upper surface of the pad is parallel to the lower surface of the substrate 25. Preferably, the taper angle or curvature of the pad 100 is selected to provide a smooth and gradually changing temperature gradient across from the center to the perimeter of the substrate 25. For example, the taper angle, thickness variation, or thermal resistance of the entire pad 100 or segments of the pad 100, can be selected to provide a difference in thermal resistance $\Delta R_P = R_{P1} - R_{P2}$ across the diameter of the pad that changes according to the temperature profile that is desired on the processing surface of the substrate 25. In one preferred embodiment, the pad 100 is tapered such that the thickness at the center of the pad of about 300 μm gradually decreases to 25 μm at the perimeter of the pad to provide a smooth temperature gradient across the processing surface of the substrate 25. The tapered pad can comprise a circular disc or one or more annular rings having a tapered cross-section.

Fabrication of the electrostatic chuck 75 and components in the chamber 20 will now be described. The various components of the process chamber 20, and the chamber itself, can be made from a variety of materials including metals, ceramics, glasses, polymers and composite materials, using conventional machining and molding methods. Preferred metals that are used to fabricate the process chamber 20 and components include aluminum, anodized aluminum, "HAYNES 242," "Al-6061," "SS 304," " SS 316," and "INCONEL."

The base 85 of the chuck 75 supporting the electrostatic member 80 can be made from a thermally and electrically conductive material such as a metal, or a thermal insulator material, such as polymer or ceramic. High thermal resistance bases are typically fabricated from ceramic or polymer materials; and low thermal resistance bases are fabricated from metals, such as aluminum or stainless steel. The thermal conductivity of metal bases is typically between about 150 Watts/m°K to about 250 Watts/m°K, and for aluminum, the thermal conductivity is about 202 Watts/m°K. The base 85 is shaped and sized to match the shape and size of the substrate 25 held on the chuck 75. For example, a base 85 suitable for semiconductor substrates (which are typically circular with diameters ranging from about 127 to 203 mm) has a right cylindrical shape with a thickness of about 15 to about 18 mm, and a diameter of about 100 to about 300 mm. The base 85 can also comprise channels through which heat transfer fluid is maintained to heat or cool the base. The upper and lower surfaces of the base 85 are polished to have a surface roughness of less than about 1 μm, so that the base can uniformly contact the pad 100 and the electrostatic member 80 and provide efficient heat transfer between the substrate 25 and the base. Preferably, the base 85 comprises a central depression 120 sized to hold the pad 100 so that the upper surface of pad is flush with the upper surface of the base and uniformly contacts the electrostatic member 80 to provide uniform heat transfer.

The electrostatic member 80 comprises a dielectric or electrical insulator 90 covering or having embedded therein, one or more electrodes 95. The electrodes 95 are made from electrically conductive material, such as, for example, copper, nickel, chromium, aluminum, iron, tungsten, and alloys thereof; and typically comprise a thickness of from about 1 μm to about 1000 μm. The insulator 90 can comprise a monolithic ceramic body of aluminum oxide, titanium oxide, silicon nitride, or mixtures and equivalents thereof, including doped ceramics that have low conductivities. The dielectric breakdown strength of the insulator 90 is preferably at least about 4 volts/μm, and preferably about 40 volts/μm. The thickness of the insulator 90 depends on its dielectric breakdown strength and dielectric constant. Typically, the dielectric constant is at least about 2, and more preferably at least about 3. For an insulator 90 having a dielectric constant of 3.5, a suitable thickness is from about 1 μm to about 100 μm.

In a preferred version, the electrostatic member 80 comprises a layer of electrically conductive material sandwiched between two insulator or dielectric layers. In this version, the insulator 90 comprises (i) a lower insulator layer on the base 85 of the chuck 75, and (ii) an upper insulator layer covering the electrode 95. This electrostatic member 80 can be fabricated from a multilayer film having an electrically conductive copper or aluminum layer on a polymer film. Suitable commercially available multilayer films include, for example, "R/FLEX 1100," comprising a 25 to 125 μm thick polyimide film with a copper layer; Ablestik brand aluminum-filled polyimide available from Ablestik Corporation; or Paralux® AP film comprising polyimide directly bonded (without an adhesive) to a copper foil. A second insulator film is adhered over the electrically conductive layer of the multilayer film to form the electrode 95 embedded in the two insulator films. Alternatively, the insulator can be fabricated from powered or layers of ceramic material as a monolithic ceramic piece.

The thermal transfer regulator pad 100 comprises material properties that are selected depending upon the temperature profile desired across the surface of the substrate 25. When a high thermal resistance $R_P$ is needed, the pad 100 comprises a thermally insulative material such as for example, polyimide, polyketone, polyetherketone, polysulfone, polycarbonate, polystyrene, nylon, polyvinylchloride, polypropylene, polyetherketone, polyethersulfone, polyethylene terephthalate, fluoroethylene propylene copolymer, cellulose, triacetate, silicone, rubber, or mixtures thereof. Preferably, the thermal transfer regulator pad 100 is fabricated from a polymer layer such as UPILEX commercially available from Ube Industries Ltd, Japan, having a thermal conductivity of 0.31 Watts/mK and a thickness of about 300 μm; KAPTON commercially available from DuPont de Nemours Company, Wilmington, Del., having a thermal conductivity of 0.12 Watts/mK and a thickness ranging from 150 to 300 μm; or AURUM (trademark) having a thermal conductivity of 0.17 Watts/mK, and a thickness of about 200 μm. Low thermal resistance pads 100 comprise highly thermally conductive materials such as high conductivity polymers. The thickness of the pad 100 is typically about 0.23 mm (0.008") to about 1.02 mm (0.040") and its diameter and shape depend upon the desired temperature profile. The pad 100 is bonded to the base 85 using adhesives, such as for example, methacrylate, polyester, polyimide, polyurethane, epoxy, silicone-containing adhesive, and mixtures thereof, and can also be bonded using thermally conductive adhesives.

EXAMPLES 1 AND 2

Examples 1 and 2 demonstrate the advantages of the electrostatic chuck of the present invention. In these examples, the steady state temperature of substrates held on electrostatic chucks 75 having thermal resistant pads 100 was measured using an infra-red sensor system. In both examples, thermal pads 100 fabricated from polyimide were positioned in a central depression 120 in an aluminum base 85 of the chuck, as illustrated in FIG. 2a. The base 85 comprised a circular aluminum disc about 7.8 inches in diameter and having a thermal conductivity of about 202 Watts/m°K. The electrostatic chucks 75 were used to electrostatically hold semiconductor substrates 25 having a polysilicon layer thereon. The substrates 25 were processed in the chamber 20 to etch the polysilicon layer using process gas comprising 135 sccm HBr and 45 sccm $Cl_2$. The pressure in the chamber 20 was maintained at about 200 mTorr. An RF bias of 525 Watts was applied to the process electrodes 55, 60. After processing, the substrates 25 were cross-sectioned and examined in a scanning electron microscope to determine the cross-sectional profile shape and angle of the etched features. The cross-sectional measurements were made across top, middle, and bottom portions of the substrate 25.

In both examples, the substrates 25 were etched at processing temperatures of about 20° C. to about 70° C. The temperature across the substrate surface was measured using an infrared sensor system focused on the substrate surface. Table 1 provides the temperatures measurements at the center and perimeter of the substrate 25. In Example 1, a circular UPILEX pad 100 comprising a diameter of 0.1143 meters (4.5") and a thickness of about $0.305 \times 10^{-3}$ meters (0.012") was positioned below the central region of the substrate 25. In Example 2, a circular KAPTON pad 100 comprising a diameter of about 0.1143 meters (4.5") and a thickness of $0.762 \times 10^{-3}$ meters (0.030") was positioned below the central portion of the substrate 25. "KAPTON" is a polyimide manufactured by DuPont de Nemours Co., Wilmington, Del. and "UPILEX" is a polyimide manufactured by Ube Indus. Ltd. Japan.

TABLE I

| Material | L in meters | k (Watts/m K) | Area in square meters | Temperature Variation (° C.) |
|---|---|---|---|---|
| Upilex | $0.305 \times 10^{-3}$ | 0.31 | $10.26 \times 10^{-3}$ | 3 to 6 higher around center |
| Kapton | $0.762 \times 10^{-3}$ | 0.12 | $10.26 \times 10^{-3}$ | 11 to 12 higher around center |

As demonstrated in Table I, the Upilex pad 100 maintained the center of the substrate at temperatures 3 to 6° C. higher than the perimeter of the substrate 25. The Kapton pad 100 was also maintained the center of the substrate about 11 to 12° C. higher than the perimeter of the substrate 25. The thermal conductivity of the Kapton thermal pad 100 was 0.12 Watts/mK and was 0.31 Watts/mK for the Upilex thermal pad. Because both thermal pads 100 had lower thermal conductivities than the base 85 (202 Watts/mK), the pads effectively lowered dissipation of heat from the area at the center of the substrate 25 to maintain temperatures at the center of the substrate higher than temperatures at the perimeter of the substrate.

EXAMPLES 3 to 5

In Examples 3 to 5, the thermal gradients and resultant processing variations were compared for electrostatic chucks with and without thermal transfer pads. Example 3 comprises an electrostatic chuck 75 that did not have a thermal transfer regulator pad 100; whereas the electrostatic chucks 75 of Examples 4 and 5 comprised multilayer thermal pads 100 that served as thermal barriers. All the examples used a thermally conductive aluminum base 85 about 195 mm in diameter. In Examples 4 and 5, the base 85 included a central depression 120 shaped and sized to receive the pad 100, the depression being substantially cylindrical in shape with a diameter of about 0.1143 meters (4.5") and a depth of about 250 to 300 $\mu$m. The upper surface of the thermal pad 100 within the depression 120 was flush with the upper surface of the base 85 around the depression of the chuck.

In Example 4, the thermal transfer regulator pad 100 comprised two circular Upilex layers, each about 0.1143 meters (4.5") in diameter and about $0.127 \times 10^{-3}$ meters (0.005") thick. The Upilex layers were adhered to one another and to the base 85 by adhesive layers having a thickness of about 25 to 50 $\mu$m (1–2 mils). The total thickness of the pad 100, including the thickness of the adhesive layers, was about 250 to 300 $\mu$m (10 to 15 mils).

In Example 5, the pad 100 comprised two circular Kapton layers, each layer about 0.1143 meters (4.5") in diameter and about 300 $\mu$m (0.014 inches) thick. The Kapton layers were adhered to one another by an adhesive layer about 25 $\mu$m (0.001 inches) thick. The multilayer pad 100 was adhered to the base 85 by an adhesive layer of about 25 $\mu$m (0.001 inches) thick. The total thickness of the pad 100 including the thickness of the adhesive layers between the base 85 and the pad 100 was about 750 $\mu$m (0.030 inches).

In each of the examples, the electrostatic chuck 75 was used to electrostatically hold a semiconductor substrate 25 having a polysilicon layer. The polysilicon layer was etched to form capacitors and gates using the same process gas composition and processing conditions identified in the previous examples. The substrate 25 was etched at processing temperatures of about 20° C. to about 70° C., and the temperature across the substrate surface was measured using an infrared sensor system focused on the substrate surface.

In Example 3, where the chuck 75 did not include a thermal pad 100, the temperature difference from the center to the perimeter of the substrate 25 was in excess of 10° C. In fact, the temperature measured at the center of the substrate 25 was typically about 11° C. lower than the temperatures at the perimeter of the substrate. This temperature variation resulted in etched features having a cross-sectional angles ranging from 85° at the central portion of the substrate to 87° at the perimeter portion of the substrate 25. Also, the etch profile was more tapered at the center of the substrate 25 due to the lower temperatures at the substrate center. The variation in etch profile and the tapered etch profile shape result in integrated circuits having non-uniform electrical properties across the substrate 25.

In Example 4, in-situ substrate temperature measurements indicated that the temperatures at the center of the substrate 25 averaged about 62° C. and the temperatures at the perimeter of the substrate averaged about 56° C. Thus the center of the substrate 25 was maintained at average temperatures about 5 to 6° C. higher than those at the perimeter of the substrate. The higher center temperatures provided etched features having substantially uniform etch profiles with sidewalls at angles of about 89–90° with respect to the surface of the substrate 25.

In Example 5, the infrared temperature sensor measured temperatures at the center of the pedestal that were about 11° C. hotter than the temperatures at the perimeter of the substrate 25. The cross-sectional profiles of etched features in the dense regions of the substrate 25 (large number of etched features) and those in the isolated regions (smaller and more spaced apart features) were examined in a scanning electron microscope. In the dense regions, the cross-sectional profiles at the top portion of the substrate 25 varied from about 87 to 88°; at a central portion of the substrate varied from 87 to 88°; and at the bottom of the substrate was about 80°. In the isolated regions, the etch profile angles at the top of the substrate varied from about 77 to 78°; the center of the substrate had etched angles of 80°; and the bottom of the substrate had etched angles of 77°. Thus, the isolated regions exhibited the reverse trend from the dense regions with the electrostatic chuck 75 providing etched features that are more tapered at the perimeter of the substrate 25 than the center. Although the results were not ideal in the isolated regions, such variations in etched feature profiles can be optimized by adjusting process parameters such as process gas flows, pressure, and plasma power.

Although the present invention has been described in considerable detail with regard to the preferred versions thereof, other versions are possible. For example, the thermal transfer regulator pad 100 can be positioned above the electrostatic chuck 75, inside or within the chuck 75, or below the base of the chuck. Alternatively, the electrostatic member, base, and pad can be fabricated as a composite multilayer structure. Therefore, the appended claims should not be limited to the descriptions of the preferred versions contained herein.

What is claimed is:

1. An electrostatic chuck for holding a substrate in a process chamber, the electrostatic chuck comprising
   (a) an electrostatic member comprising a dielectric covering an electrode, the dielectric having a receiving surface for receiving the substrate; and
   (b) a pad positioned below the electrostatic member, the pad comprising a disc of thermally insulating material having a diameter smaller than a diameter of the substrate to control thermal transfer rates from a portion of the substrate during processing of the substrate in the chamber.

2. The electrostatic chuck of claim 1 further comprising a base below the electrostatic member, the base having a first thermal resistance $R_B$ and wherein the pad comprises a second thermal resistance $R_P$ that is sufficiently higher or lower than the first thermal resistance $R_B$ of the base, to provide predetermined temperatures across the substrate surface.

3. The electrostatic chuck of claim 2 wherein the second thermal resistance $R_P$ is such that the difference in thermal resistance $\Delta R = R_P - R_B$ is sufficiently high to maintain substantially the same temperatures across the substrate surface.

4. The electrostatic chuck of claim 2 wherein the second thermal resistance $R_P$ is such that a difference in thermal resistance $\Delta R = R_P - R_B$ is sufficiently high to provide a temperature profile having temperatures that differ by 0° C. to 10° C. across the substrate surface.

5. The electrostatic chuck of claim 4 wherein the difference in thermal resistance $\Delta R = R_P - R_B$ is from about 10 to about 1000 K/W.

6. The electrostatic chuck of claim 2 wherein a thermal conductivity of the base is from 20 to 2000 Watts/mK, and wherein a thermal conductivity of the pad is from 0.01 to 3.0 Watts/mK.

7. The electrostatic chuck of claim 2 wherein the pad is positioned in a depression in the base.

8. The electrostatic chuck of claim 2 wherein the thermal resistance $R_B$ is from $0.2 \times 10^{-3}$ to $20 \times 10^{-3}$ K/W, and the thermal resistance $R_P$ is from $50 \times 10^{-3}$ to $400 \times 10^{-3}$ K/W.

9. A process chamber comprising:
   (a) a gas distributor system for introducing process gas into the process chamber;
   (b) a plasma generator for forming a plasma from the process gas; and
   (c) the electrostatic chuck of claim 2 for holding a substrate in the process chamber.

10. A method of electrostatically holding a substrate and maintaining predetermined temperatures across the substrate, the method comprising the steps of:
    (a) electrostatically holding the substrate on a receiving surface of an electrostatic member;
    (b) maintaining first thermal pathways having a thermal resistance $R_B$, below portions of the substrate; and
    (c) maintaining second thermal pathways having a thermal resistance $R_P$, in a circular region below other portions of the substrate, the thermal resistance $R_P$ being sufficiently higher than the thermal resistance $R_B$, to provide predetermined temperatures across the substrate during processing of the substrate.

11. A method according to claim 10 characterized in that the first thermal pathways are maintained by providing a base supporting the electrostatic member, the base having a lower surface, and the second thermal pathways are maintained by providing a pad between the receiving surface of the electrostatic member and the lower surface of the base.

12. A method according to claim 10 characterized in that the difference in thermal resistances $\Delta R = R_P - R_B$ is selected to maintain substantially the same temperatures across the substrate.

13. A method according to claim 10 characterized in that the difference in thermal resistances $\Delta R = R_P - R_B$ is selected to maintain temperatures at the center of the substrate that are 0° C. to 10° C. higher than temperatures at the perimeter of the substrate.

14. A method according to claim 10 comprising the initial steps of:
    (1) measuring a steady state temperature profile across a substrate surface, during processing of the substrate;
    (2) correlating the steady state temperature profile to variations in processing characteristics across the substrate surface; and
    (3) selecting a difference in thermal resistances $\Delta R = R_P - R_B$, of the first and second thermal pathways, that substantially reduces the variations in the processing characteristics across the substrate surface.

15. An electrostatic chuck for holding a substrate in a process chamber, the electrostatic chuck comprising:
    (a) an electrostatic member comprising a dielectric covering an electrode, the dielectric having a receiving surface for receiving the substrate; and
    (b) a thermally insulating means for controlling thermal transfer rates from different portions of the substrate to maintain predetermined temperatures across the substrate during processing of the substrate in the process chamber, the means comprising a disc having a diameter smaller than a diameter of the substrate.

16. The electrostatic chuck of claim 15 further comprising a base below the electrostatic member and wherein the thermally insulating means is positioned between the electrostatic member and the base.

17. The electrostatic chuck of claim 16 wherein the base comprises a first thermal resistance $R_B$ and wherein the thermally insulating means comprises a second thermal resistance $R_P$ that is sufficiently higher or lower than the thermal resistance $R_B$ of the base, to provide predetermined temperatures across the substrate surface by regulating thermal transfer rates from different portions of the electrostatic member.

18. The electrostatic chuck of claim 17 wherein the thermally insulation means comprises a thermal resistance $R_P$ such that the difference in thermal resistance $\Delta R = R_P - R_B$ is sufficiently high to maintain substantially the same temperatures across the substrate surface.

19. The electrostatic chuck of claim 17 wherein the thermally insulating means comprises a thermal resistance $R_P$ such that the difference in thermal resistance $\Delta R = R_P - R_B$ is sufficiently high to provide a temperature profile having temperatures that differ by 0° C. to 10° C. across the substrate surface.

20. The electrostatic chuck of claim 17 wherein the thermal resistance $R_B$ is from $0.2 \times 10^{-3}$ to $20 \times 10^{-3}$ K/W, and the thermal resistance $R_P$ is from $50 \times 10^{-3}$ to $400 \times 10^{-3}$ K/W.

21. A method of fabricating an electrostatic chuck for holding a substrate, the method comprising the steps of:
    (a) forming an electrostatic member comprising an electrode covered by an insulator, the electrostatic member having a receiving surface for receiving the substrate thereon;

(b) forming a base; and (c) forming a disc of thermally insulating material, the disc having a diameter smaller than a diameter of the electrostatic member, and positioning the disc between the electrostatic member and the base, whereby the disc controls the temperatures across the substrate by regulating thermal transfer rates from different portions of the substrate.

22. A method according to claim 21 wherein step (c) comprises the step of filling a depression in the base or electrostatic member with a thermally insulating material.

23. A method according to claim 21 wherein step (c) comprises the step of filling a depression in the electrostatic member or electrostatic member with a thermally insulating material.

24. A method according to claim 21 wherein the thermally insulating material is selected to have a thermal resistance $R_P$ that is sufficiently different from a thermal resistance of the base $R_B$ to maintain temperatures at the center of the substrate that are from 0° C. to 10° C. higher than temperatures at the perimeter of the substrate.

25. A method according to claim 24 wherein the difference in thermal resistances $\Delta R = R_P - R_B$ is selected to maintain substantially the same temperatures across the substrate.

26. A method according to claim 21 wherein step (c) comprises the step of forming a disc having a tapered cross-section.

27. A method according to claim 26 wherein the cross-section tapers from a center of the disc to a periphery of the disc.

28. A method according to claim 21 wherein step (c) comprises the step of forming a disc from a ceramic or polymer.

29. An electrostatic chuck for holding a substrate in a process chamber, the electrostatic chuck comprising (a) an electrostatic member comprising a dielectric covering an electrode, the dielectric having a receiving surface for receiving the substrate;

(b) a base having a surface on which the electrostatic member is supported, the surface having a depression; and (c) a pad of thermally insulating material positioned in the depression of the base, the pad comprising a disc having a diameter smaller than the diameter of the substrate, whereby the pad controls temperatures across the substrate by regulating thermal transfer rates from different portions of the substrate.

30. The electrostatic chuck of claim 29 wherein the base comprises a first thermal resistance $R_B$ and wherein the pad comprises a second thermal resistance $R_P$.

31. The electrostatic chuck of claim 30 wherein the pad comprises a disc having a tapered cross-section.

32. The electrostatic chuck of claim 31 wherein the cross-section tapers from a center to a periphery of the disc.

33. The electrostatic chuck of claim 30 wherein the second thermal resistance $R_P$ is such that a difference in thermal resistance $\Delta R = R_P - R_B$ is sufficiently high to provide a temperature profile having temperatures that differ by 0° C. to 10° C. across the substrate surface.

34. The electrostatic chuck of claim 30 wherein the second thermal resistance $R_P$ is such that the difference in thermal resistance $\Delta R = R_P - R_B$ is sufficiently high to maintain substantially the same temperatures across the substrate surface.

35. The electrostatic chuck of claim 30 wherein the difference in thermal resistance $\Delta R = R_P - R_B$ is from about 10 to about 1000 K/W.

36. The electrostatic chuck of claim 30 wherein the thermal resistance $R_B$ is from about $0.2 \times 10^{-3}$ to about $20 \times 10^3$ K/W, and the thermal resistance $R_P$ is from about $50 \times 10^{-3}$ to about $400 \times 10^{-3}$ K/W.

37. The electrostatic chuck of claim 29 wherein a thermal conductivity of the base is from about 20 to about 2000 Watts/mK, and wherein a thermal conductivity of the pad is from about 0.01 to about 3.0 Watts/mK.

38. A process chamber comprising:

(a) a gas distributor system for introducing process gas into the process chamber;

(b) a plasma generator for forming a plasma from the process gas; and (c) the electrostatic chuck of claim 30 for holding a substrate in the process chamber.

* * * * *